United States Patent
Moden

(10) Patent No.: US 6,861,290 B1
(45) Date of Patent: Mar. 1, 2005

(54) FLIP-CHIP ADAPTOR PACKAGE FOR BARE DIE

(75) Inventor: Walter L. Moden, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/699,537

(22) Filed: Oct. 30, 2000

Related U.S. Application Data

(62) Division of application No. 09/483,483, filed on Jan. 14, 2000, now Pat. No. 6,265,766, which is a continuation of application No. 08/948,936, filed on Oct. 10, 1997, now Pat. No. 6,201,304, which is a continuation of application No. 08/574,662, filed on Dec. 19, 1995, now Pat. No. 5,719,440.

(51) Int. Cl.⁷ .............................................. H01L 21/44
(52) U.S. Cl. ....................................... 438/118; 438/127
(58) Field of Search ................................ 438/118, 127

(56) References Cited

U.S. PATENT DOCUMENTS

| | | | |
|---|---|---|---|
| 4,446,477 A | | 5/1984 | Currie et al. |
| 4,975,765 A | * | 12/1990 | Ackermann et al. ........... 357/80 |
| 5,086,018 A | * | 2/1992 | Conru et al. ................... 29/827 |
| 5,099,309 A | * | 3/1992 | Kryzaniwsky ............... 257/700 |
| 5,107,329 A | * | 4/1992 | Okinaga et al. ............... 357/74 |
| 5,218,234 A | | 6/1993 | Thompson et al. |
| 5,222,014 A | | 6/1993 | Lin |
| 5,239,198 A | * | 8/1993 | Lin et al. ...................... 257/693 |
| 5,286,679 A | * | 2/1994 | Farnworth et al. ........... 438/118 |
| 5,293,068 A | | 3/1994 | Kohno et al. |
| 5,313,096 A | * | 5/1994 | Eide ............................. 257/686 |
| 5,384,689 A | * | 1/1995 | Shen ............................ 361/761 |
| 5,434,106 A | * | 7/1995 | Lim et al. ...................... 29/827 |
| 5,434,452 A | | 7/1995 | Higgins |
| 5,473,512 A | * | 12/1995 | Degani et al. ................ 361/760 |
| 5,486,723 A | | 1/1996 | Ma et al. |
| 5,508,556 A | * | 4/1996 | Lin ............................... 257/691 |
| 5,541,450 A | * | 7/1996 | Jones et al. ................... 257/697 |
| 5,615,089 A | * | 3/1997 | Yoneda et al. ............... 361/764 |
| 5,636,104 A | * | 6/1997 | Oh ................................ 361/777 |
| 5,637,915 A | * | 6/1997 | Sato et al. .................... 257/666 |
| 5,674,785 A | * | 10/1997 | Akram et al. .................. 438/15 |
| 5,714,405 A | * | 2/1998 | Tsubosaki et al. ........... 438/118 |
| 5,933,710 A | * | 8/1999 | Chia et al. ...................... 21/44 |
| 5,952,611 A | | 9/1999 | Eng et al. |
| 6,013,946 A | | 1/2000 | Lee et al. |
| 6,013,948 A | * | 1/2000 | Akram et al. ................ 257/698 |
| 6,046,072 A | * | 4/2000 | Matsuura et al. ............ 438/118 |
| 6,048,755 A | | 4/2000 | Jiang et al. |
| 6,091,140 A | | 7/2000 | Toh et al. |
| 6,097,085 A | | 8/2000 | Ikemizu et al. |
| 6,262,477 B1 | * | 7/2001 | Mahulikar et al. ........... 257/698 |

FOREIGN PATENT DOCUMENTS

| | | | |
|---|---|---|---|
| JP | 4-30544 | | 2/1992 |
| JP | 4-107964 | | 4/1992 |
| JP | 40728274 A | * | 10/1995 |

\* cited by examiner

*Primary Examiner*—Paul E Brock, II
(74) *Attorney, Agent, or Firm*—TraskBritt

(57) ABSTRACT

A board for connecting a bare semiconductor die with a bond pad arrangement which does not conform to a master printed circuit board with a specific or standardized pin out, connector pad, or lead placement arrangement. The board comprises a printed circuit board including first elements, such as minute solder balls, pins, or bond wires, for making electrical contact between the board and the master board, and second elements, such as minute solder balls, pins, or bond wires, for making electrical contact between the semiconductor die and the board. The board has circuit traces for electrical communication between the board/master board electrical contact elements, and the semiconductor die board electrical contact elements.

4 Claims, 4 Drawing Sheets

FLIP-CHIP ADAPTOR PACKAGE FOR BARE DIE

CROSS-REFERENCE TO RELATED APPLICATIONS

This application is a divisional of application Ser. No. 09/483,483, filed Jan. 14, 2000, now U.S. Pat. No. 6,265,766 B1, issued Jul. 24, 2001, which is a continuation of application Ser. No. 08/948,936, filed Oct. 10, 1997, now U.S. Pat. No. 6,201,304 B1, issued Mar. 13, 2001, which is a continuation of application Ser. No. 08/574,662, filed Dec. 19, 1995, now U.S. Pat. No. 5,719,440, issued Feb. 17, 1998.

BACKGROUND OF THE INVENTION

1. Field of the Invention

The present invention relates to an apparatus for connecting a bare semiconductor die having a size and bond pad arrangement, either solder ball arrangement, or pin arrangement (hereinafter referred to generally as a "terminal arrangement"), which does not conform to a printed circuit board with a specific or standardized pin out, connector pad, or lead placement (hereinafter referred to generally as a "connection arrangement"). More particularly, the present invention relates to an intermediate conductor-carrying substrate (hereinafter referred to generally as an "adaptor board") for connecting a non-conforming bare die to another printed circuit board having a given connection arrangement (hereinafter referred to generally as a "master board").

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board, including flip-chip attachment, wire bonding, and tape automated bonding ("TAB").

Flip-Chip: A chip or die that has bumped terminations spaced around the active surface of the die and is intended for facedown mounting.

Flip-Chip Attachment: A method of attaching a semiconductor die to a substrate in which the die is flipped so that the connecting conductor pads on the face of the die are set on mirror-image pads on the substrate (i.e. printed circuit board) and bonded by refluxing the solder.

Glob Top: A glob of encapsulant material (usually epoxy or silicone or a combination thereof) surrounding a semiconductor die in the COB assembly process.

PGA—Pin Grid Array: An array of small pins extending substantially perpendicularly from the major plane of a semiconductor die, wherein the pins conform to a specific arrangement on a printed circuit board for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three semiconductor dies to printed circuit boards attachment techniques: flip-chip attachment, wire bonding, and TAB.

Flip-chip attachment consists of attaching a semiconductor die, generally having a BGA, a SLICC or a PGA, to a printed circuit board. With the BGA or SLICC, the solder ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board to prevent contamination. A variation of the pin-in-recess PGA is a J-lead PGA, wherein the loops of the Js are soldered to pads on the surface of the circuit board. Nonetheless, the lead and pad locations must coincide, as with the other referenced flip-chip techniques.

Wire bonding and TAB attachment generally begins with attaching a semiconductor die to the surface of a printed circuit board with an appropriate adhesive. In wire bonding, a plurality of bond wires are attached, one at a time, from each bond pad on the semiconductor die and to a corresponding lead on the printed circuit board. The bond wires are generally attached through one of three industry-standard wire bonding techniques: ultrasonic bonding, using a combination of pressure and ultrasonic vibration bursts to form a metallurgical cold weld; thermocompression bonding, using a combination of pressure and elevated temperature to form a weld; and thermosonic bonding, using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, metal tape leads are attached between the bond pads on the semiconductor die and the leads on the printed circuit board. An encapsulant is generally used to cover the bond wires and metal tape leads to prevent contamination.

Although the foregoing methods are effective for bonding semiconductor dice to printed circuit boards, the terminal arrangements of the dice and the connection arrangements of the boards must be designed to accommodate one another. Thus, it may be impossible to electrically connect a particular semiconductor die to a printed circuit board for which the semiconductor die terminal arrangement was not designed to match the board's connection arrangement. With either wire bond or TAB attachment, the semiconductor die bond pad may not correspond to the lead ends on the circuit board, and thus attachment is either impossible or extremely difficult due to the need for overlong wires and the potential for inter-wire contact and shorting. With flip-chip attachment, if the printed circuit board connection arrangement is not a mirror-image of the solder ball or pin arrangement (terminal arrangement) on the semiconductor die, electrically connecting the flip-chip to the printed circuit board is impossible.

Therefore, it would be advantageous to develop an apparatus for connecting a semiconductor die having a size and bond pad arrangement, solder ball arrangement, or pin arrangement ("I/O pattern") which does not conform to a printed circuit board with a specific or standardized pin out, connection pad location, or lead placement ("I/O pattern").

BRIEF SUMMARY OF THE INVENTION

The present invention relates to an intermediate printed circuit board or other conductor-carrying substrate that functions as an adaptor board for electrically connecting one or more bare semiconductor dice of a variety of sizes and bond pad locations, solder ball arrangement, or pin arrangement, to a master printed circuit board with a specific or standardized pin out, connector pad location, or lead placement.

An adaptor printed circuit board or substrate ("adaptor board") is sized and configured with an I/O pattern to accommodate its attachment to the master printed circuit board ("master board"). If the master board is configured to receive a specific pin out or specific connector pad locations, the adaptor board is configured on its master board attachment surface with pins or solder balls in mirror-image to the master board connection arrangement to make electrical contact with the specific pin out or connector pads on the printed circuit board. If the master board is configured to receive a bond wire, the adaptor board is configured and sized to provide wire bond pads on its upper surface closely adjacent the bond pads of the master board leads. The adaptor board can, of course, be configured to accommodate other attachment and electrical connection means known in the industry, as well as other components in addition to the semiconductor die or dice carried thereon.

On the semiconductor die side of the adaptor board, one or more semiconductor dice are attached. If a "flip-chip" die is attached to the adaptor board, the adaptor board will, of course, be configured with an I/O pattern to receive the flip-chip with a specific pin out or connector pad locations. The pin out or connector pads on the adaptor board are connected to circuit traces on or through the adaptor board. The circuit traces form the electrical communication path from the pin recesses or connector pads on the adaptor board to the connection points to the master board.

If a "leads over" die is used with the adaptor board, the bond pads on the die are wire bonded to the adaptor board. Preferably, the leads over die is attached to the adaptor board with the bond pads facing the adaptor board. The bond wires are attached to the leads over die bond pads and extend into a via or vias in the adaptor board. The bond wires are attached to an I/O pattern of adaptor board bond pads within the via from which circuit traces extend, or to leads on the master board side of the adaptor board.

It is, of course, understood that the leads over die can be attached to the adaptor board with the bond pads facing away from the adaptor board. Thus, the bond wires are simply attached to the bond pads on the leads over die and to a corresponding I/O pattern of adaptor board pad on the semiconductor die side of the adaptor board.

Preferably, the exposed circuitry of the die and the die-to-adaptor board interconnection is sealed from contamination by a glob top after wire bonding or an underflow compound in the case of a flip-chip attachment.

Furthermore, it is understood that with the use of wire bonds, the adaptor boards can be stacked on top of each other and connected to the adaptor board as by wire bonding.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
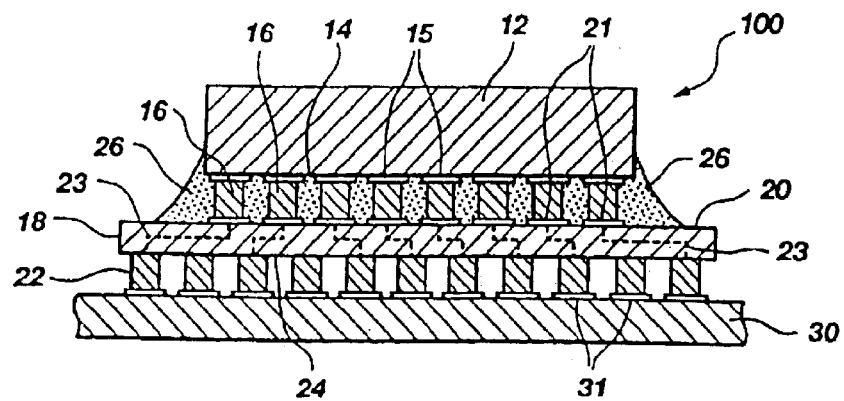
FIG. 1 is a side view of one embodiment of the present invention.

FIG. 1 illustrates a first embodiment of the present invention designated as a flip-chip style/flip-chip attachment assembly 100. Assembly 100 comprises a semiconductor die 12 having an inverted active surface 14 with at least one flip-chip electric connection 16 (such as a C4solder bump connection, a pin connection, or a surface mount j-lead connection, by way of example) extending substantially perpendicularly from a bond pad 15 on the semiconductor die active surface 14. The flip-chip electric connections 16 are attached to an upper surface 20 of an adaptor board 18 in such a manner that the flip-chip electric connections 16 make electrical contact with electrical contact elements 21 in or on the surface of adaptor board 18. The electrical contact elements 21 make electrical communication between each flip-chip electric connection 16, through circuit traces 23 (exemplary traces shown in broken lines) in the adaptor board 18, to at least one master board connector 22 extending substantially perpendicularly from a lower surface 24 of the adaptor board 18 to connect adaptor board 18 to an aligned terminal 31 on master board 30. Preferably, a sealing compound 26 is disposed between the semiconductor die 12 and the adaptor board 18 to prevent contamination of the flip-chip electric connections 16 and to more firmly secure semiconductor die 12 to adaptor board 18.

In actual practice, there will be a plurality of terminals 31 arranged in a specific, perhaps industry-standard pattern, on master board 30, and master board connectors will be arranged in a mirror-image pattern to terminals 31 for mating connection therewith. Master board connectors 22 and terminals 31 may comprise any electrical connection mechanism known in the art, in addition to those previously described herein.

Figure 2:
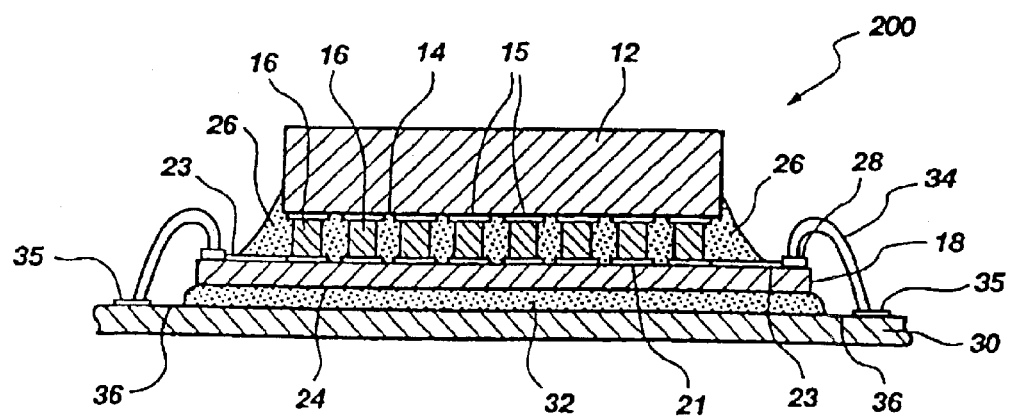
FIG. 2 is a side view of a second embodiment of the present invention.
Figure 2A:
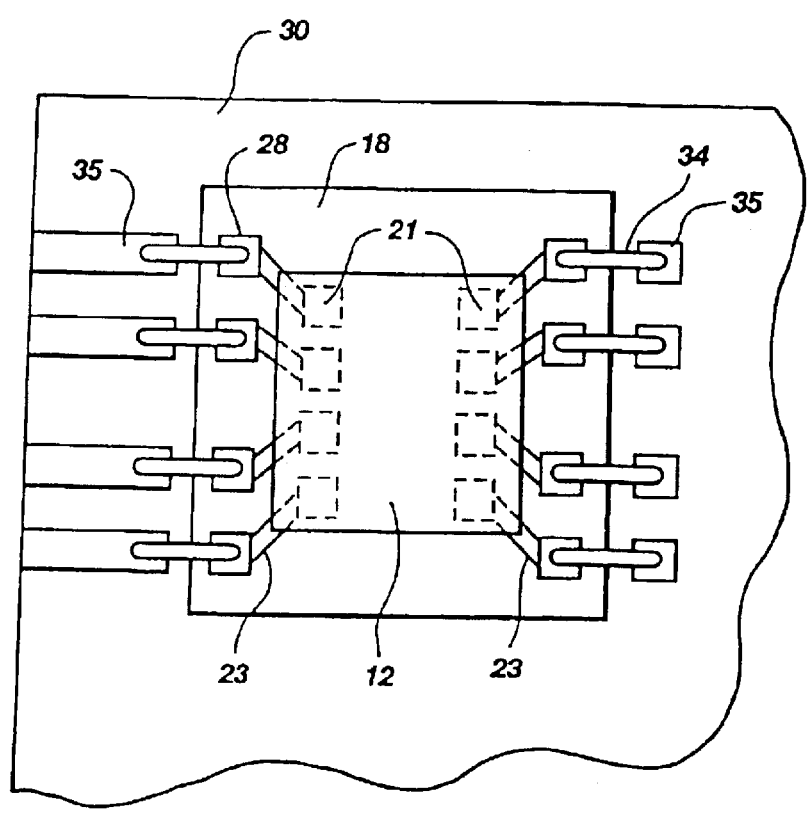
FIG. 2A is a top view of the second embodiment of the present invention shown in FIG. 2.

FIGS. 2 and 2A illustrate a second embodiment of the present invention designated as a flip-chip style/wire bond attachment assembly 200. Components common to both FIG. 1 and FIG. 2 retain the same numeric designation. The assembly 200 comprises the semiconductor die 12 having active surface 14 with at least one flip-chip electric connection 16, as known in the art, extending substantially perpendicularly from a bond pad 15 on the semiconductor die active surface 14. The flip-chip electric connections 16 are attached to the adaptor board upper surface 20 in such a manner that the flip-chip electric connections 16 make electrical contact with electrical contact elements 21 on the adaptor board 18. The electrical contact elements 21 communicate between each flip-chip electric connection 16 to bond pads 28 on the adaptor board upper surface 20 through circuit traces 23. The adaptor board lower surface 24 is bonded to an upper surface 36 of a master board 30 with an adhesive 32, which may comprise a liquid or gel adhesive, or an adhesive tape, all as known in the art. If desired, adhesive 32 may be a heat-conductive adhesive. A wire bond 34 extends from each adaptor board bond pad 28 to a corresponding bond pad or lead end 35 on the upper surface of master board 30, bond pad or lead end 35 communicating with other components mounted to master board 30 or with other components on other boards or other assemblies through circuit traces or other conductors known in the art.

Figure 3:
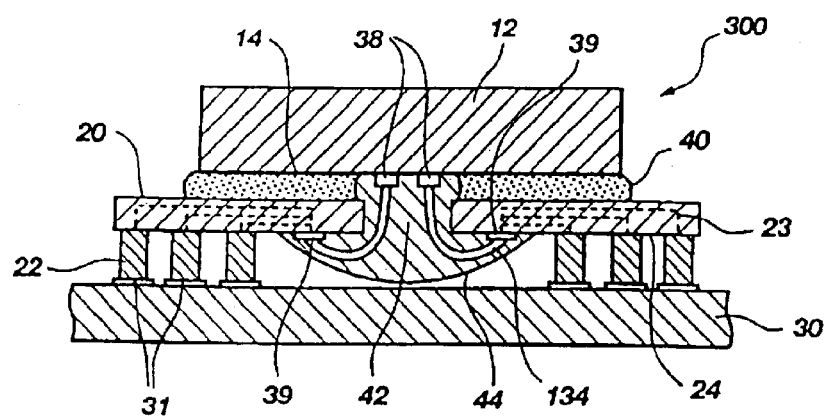
FIG. 3 is a side view of a third embodiment of the present invention.
Figure 3A:
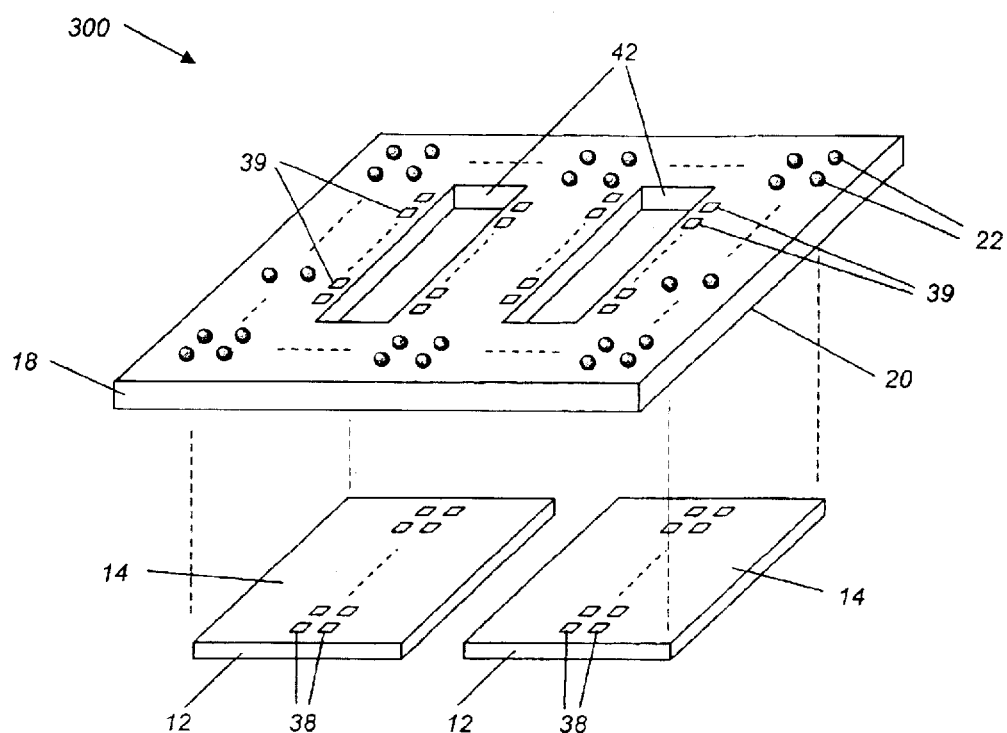
FIG. 3A is an upside-down exploded perspective view of selected portions of the third embodiment.

FIGS. 3 and 3A illustrate a third embodiment of the present invention designated as a wire bond style/flip-chip attachment assembly 300. Components which are common to the previous figures retain the same numeric designation. The assembly 300 comprises an inverted semiconductor die 12 having active surface 14 with at least one bond pad 38 on the semiconductor die active surface 14. As illustrated, the bond pads 38 are arranged in two rows extending down the longitudinal axis of semiconductor die 12 being located transverse to the plane of the page, such an arrangement commonly being used for a "leads over" connection to frame leads extending over the die in its normal, upright position. The semiconductor die active surface 14 is bonded to the adaptor board upper surface 20 with an insulating, sealing adhesive 40. The adaptor board 18 includes at least one or more wire bond vias 42 which is located in a position or positions aligned with the semiconductor die bond pads 38. Each individual wire bond 134 is connected to each corresponding individual semiconductor die bond pad 38. Each wire bond 134 extends from the semiconductor die bond pad 38 to a corresponding bond pad or lead 39 on the adaptor board lower surface 24, which communicates with master board connectors 22 through circuit traces 23. The master board terminals 31 are in electrical communication with at least one master board connector 22 extending substantially perpendicularly from the adaptor board lower surface 24. Preferably, a sealant 44 encases the bond wires 134 and seals the wire bond via 42 to prevent contamination and damage to the wire bonds.

Figure 4:
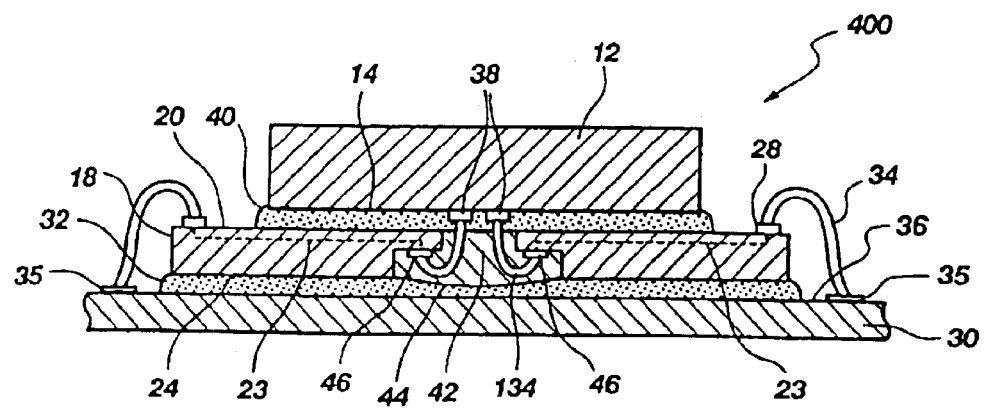
FIG. 4 is a side view of a fourth embodiment of the present invention.

FIG. 4 illustrates a fourth embodiment of the present invention designated as a wire bond style/wire bond attachment assembly 400. Components which are common to the previous figures retain the same numeric designation. The assembly 400 comprises the semiconductor die 12 having active surface 14 with at least one bond pad 38 on the semiconductor die active surface 14. As with the embodiment of FIG. 3, semiconductor die 12 in this instance employs bond pads 38 in a "leads over" configuration. The semiconductor die active surface 14 is bonded to the adaptor board upper surface 20 with an insulating, sealing adhesive 40. The adaptor board 18 includes at least one wire bond via 42 which is located in a position or positions aligned with the semiconductor die bond pads 38. Each individual wire bond 134 is connected to each corresponding semiconductor die bond pad 38. Each wire bond 134 extends from the semiconductor die bond pad 38 to a corresponding bond pad 46 within the wire bond via 42. The via bond pads 46 are in electrical communication through circuit traces 23 with at least one corresponding adaptor board bond pad 28. The adaptor board lower surface 24 is bonded to the master board upper surface 36 with the adhesive 32. Wire bonds 34 extend from the adapter board upper surface 20 to a corresponding bond pad or lead on the master board upper surface 36. Preferably, the wire bond via sealant 44 encases the bond wires 134 and seals the wire bond via 42 to prevent contamination.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming a wire bond style/flip-chip attachment assembly electrically connecting a semiconductor die having a bond pad pattern to a first substrate having a connector pattern arrangement when the semiconductor die is attached to second adaptor substrate having an upper surface and having a second surface having a connector pattern thereon, comprising:

providing an inverted bare semiconductor die having a surface having a plurality of bond pads extending along a longitudinal axis of the semiconductor die on the surface in a first bond pad pattern different than the connector pattern arrangement of the first substrate;

providing a second adaptor substrate having a die side surface, a second attachment surface, at least one via extending through the second adaptor substrate from the die side surface to the second attachment surface, a plurality of circuits, and a plurality of bond pads located on the second attachment surface having a connector pattern connected to the plurality of circuits matching the connector pattern arrangement of the first substrate and a plurality of bond pads located in a first bond pad pattern connected to the plurality of circuits matching the first bond pad pattern of the inverted bare semiconductor die;

applying an adhesive to a portion of the die side of the second adaptor substrate to attach the inverted bare semiconductor die thereto;

attaching a portion of the surface having a plurality of bond pads thereon of the inverted bare semiconductor die to a portion of the die side surface of the second substrate locating the bare semiconductor die above the second adaptor substrate having the bond pads of the semiconductor die located over the via in the second adaptor substrate;

connecting the plurality of bond pads of the inverted bare semiconductor die to the plurality of bond pads on the second attachment surface of the second adaptor substrate using a plurality of wire bonds, the plurality of wire bonds extending through the at least one via extending from bond pads of the inverted bare semiconductor die located on the die side surface of the second adaptor substrate through the second adaptor substrate to the second attachment surface of the second adaptor substrate, the plurality of wire bonds connected to the first bond pad pattern of the bare inverted semiconductor die and to the matching first bond pad pattern on the second attachment surface of the second adaptor substrate;

filling at least a portion of the via in the substrate with a sealant; and connecting the second adaptor substrate to the first substrate having the second substrate located solely on one side of the first substrate, the connections between the first substrate and the adaptor second substrate formed by a plurality of adaptor board connectors extending between the matching connector pattern on the second attachment surface of the second adaptor substrate to the connector arrangement of the first substrate.

2. A method of forming a wire bond style/flip-chip attachment assembly electrically connecting a semiconductor die having a first bond pad pattern to a master board having a connector pattern arrangement, comprising:

providing an inverted bare semiconductor die having a plurality of bond pads located in at least two rows extending down the longitudinal axis of the inverted bare semiconductor die thereon, the plurality of bond pads located in the at least two rows having a first bond pad pattern;

providing a master board having a plurality of circuit traces on an upper surface thereof connected to a plurality of connectors in a second connector pattern arrangement located thereon different than the first bond pad pattern of the plurality of bond pads of the inverted bare semiconductor die;

providing an adaptor board having a die side surface, a second attachment surface, a via extending through the adaptor board from the die side surface to the second attachment surface, a plurality of circuits, a plurality of bond pads located on the second attachment surface of the adaptor board having a plurality of bond pads connected to the plurality of circuits matching the first bond pad pattern of the plurality of bond pads of the inverted bare semiconductor die, and having a connector pattern connected to the plurality of circuits matching the connector pattern arrangement of the plurality of connectors of the master board;

providing a plurality of electrical connectors for connecting the connector pattern connected to the plurality of circuits matching the connector pattern arrangement of the plurality of connectors of the master board located on the second attachment surface of the adaptor board to the plurality of connectors in a second connector pattern arrangement of the circuit traces of the master board;

attaching a portion of the inverted bare semiconductor die to a portion of the die side surface of the adaptor board;

connecting the plurality of bond pads of the inverted bare semiconductor die to the plurality of bond pads of the adaptor board using a plurality of wire bonds, the plurality of wire bonds extending through the via extending through the adaptor board having a portion thereof attached to the plurality of bond pads on the second attachment surface of the adaptor board and having a portion thereof attached to the plurality of bond pads on the bare semiconductor die; and connecting the adaptor board and master board using the plurality of electrical connectors on the adaptor board to the plurality of circuit traces on the master board using the plurality of electrical connectors.

3. A method of forming a wire bond style/flip-chip attachment assembly attaching a semiconductor die having a first bond pad pattern to a first substrate having a connector pattern arrangement for attaching the first substrate to a second adaptor substrate having an upper surface and having a second surface having a connector pattern thereon and having a plurality of circuit traces thereon, comprising:

providing an inverted bare semiconductor die having a surface having a plurality of bond pads located along a longitudinal axis of the inverted bare semiconductor die on the surface extending in a leads-over configuration on the surface, the plurality of bond pads having a first bond pad pattern different than the connector pattern arrangement of the first substrate;

providing a second adaptor substrate having a die side surface, a second attachment surface, at least one via extending through a board from the die side surface to the second attachment surface, a plurality of circuits, and a plurality of bond pads located on the second attachment surface of the second adaptor substrate having a connector pattern thereon connected to the plurality of circuits matching the connector pattern arrangement of the first substrate and a plurality of bond pads connected to the plurality of circuits in a bond pad pattern matching the first bond pad pattern of the inverted bare semiconductor die;

applying an adhesive to a portion of the die side of the second adaptor substrate to attach the inverted bare semiconductor die thereto;

attaching a portion of the surface having a plurality of bond pads thereon of the bare semiconductor die to a portion of the die side surface of the second substrate;

connecting the plurality of bond pads of the inverted bare semiconductor die to the plurality of bond pads of the second adaptor substrate using a plurality of bond wires, the plurality of bond wires extending through the at least one via extending through the second adaptor substrate, the plurality of bond wires connected to the first bond pad pattern of the plurality of bond pads of the inverted semiconductor die and to the matching first bond pad pattern of the plurality of bond pads on the second attachment surface of the second adaptor substrate; and attaching the first substrate to the second attachment surface of the second adaptor substrate using a plurality of adaptor board connectors extending from the second attachment surface of the second adaptor substrate.

4. A method of forming a wire bond style/flip-chip attachment assembly attaching a semiconductor die to a master board, comprising:

providing an inverted bare semiconductor die having a plurality of bond pads in at least two rows having a first bond pad arrangement located down the longitudinal axis of a surface of the inverted bare semiconductor die in a leads over chip configuration;

providing a master board having a plurality of circuit traces on an upper surface thereof connected to a plurality of connectors in a connector pattern arrangement located thereon, the upper surface for the receipt of an adaptor board therein;

providing an adaptor board having a die side surface, a second attachment surface, at least one via extending through the adaptor board from the die side surface to the second attachment surface, a plurality of circuits, a plurality of bond pads located on the second attachment surface of the adaptor board having a plurality of bond pads connected to the plurality of circuits in a first bond pad pattern matching the first bond pad pattern of the inverted bare semiconductor die, and having a connector pattern thereon connected to the plurality of circuits matching the connector pattern arrangement of the master board;

providing a plurality of electrical connectors for connecting the connector pattern of the plurality of circuits located on the second attachment surface of the adaptor board to the plurality of circuits of the master board;

attaching a portion of the inverted bare semiconductor die to a portion of the die side surface of the adaptor board;

connecting the plurality of bond pads in a first bond pad arrangement of the bare semiconductor die to the plurality of bond pads in a matching first bond pad pattern of the adaptor board using a plurality of bond wires extending through the via extending through the adaptor board from the die side surface to the second attachment surface; and connecting the adaptor board and master board using the plurality of connectors on the master board to at least one circuit trace of the plurality of circuit traces on the master board using adaptor board.

* * * * *

UNITED STATES PATENT AND TRADEMARK OFFICE
CERTIFICATE OF CORRECTION

PATENT NO. : 6,861,290 B1  Page 1 of 1
APPLICATION NO. : 09/699537
DATED : March 1, 2005
INVENTOR(S) : Walter L. Moden It is certified that error appears in the above-identified patent and that said Letters Patent is hereby corrected as shown below:

On the title page:
In ITEM (56) "References Cited,
U.S. Patent Documents,"
COLUMN 1, LINE 15, insert --5,454,161  10/1995  Beilin et al.--
COLUMN 2, LINE 17, insert --6,165,766  07/2001  Moden--

COLUMN 4, LINE 19, change "C4solder" to --C4 solder--

Signed and Sealed this

Twenty-eighth Day of August, 2007

JON W. DUDAS
*Director of the United States Patent and Trademark Office*